United States Patent [19]
Callicott et al.

[11] Patent Number: 6,097,218
[45] Date of Patent: Aug. 1, 2000

[54] METHOD AND DEVICE FOR ISOLATING NOISE SENSITIVE CIRCUITRY FROM SWITCHING CURRENT NOISE ON SEMICONDUCTOR SUBSTRATE

[75] Inventors: Steven P. Callicott; Mark S. Miquelon, both of Colorado Springs, Colo.

[73] Assignee: LSI Logic Corporation, Milpitas, Calif.

[21] Appl. No.: 08/777,686

[22] Filed: Dec. 20, 1996

[51] Int. Cl.[7] ............................................. H03K 19/0175
[52] U.S. Cl. ................................ 326/82; 326/26; 326/86; 395/856
[58] Field of Search .......................... 326/30, 86, 82–83, 326/26, 90; 395/856, 872

[56] References Cited

U.S. PATENT DOCUMENTS

| | | | |
|---|---|---|---|
| 3,795,828 | 3/1974 | Cavaliere et al. | |
| 4,048,629 | 9/1977 | Bormann | 340/173 |
| 4,275,312 | 6/1981 | Saitou et al. | |
| 4,580,216 | 4/1986 | Bellay et al. | 364/200 |
| 4,945,264 | 7/1990 | Lee et al. | 326/90 |
| 4,983,860 | 1/1991 | Yim et al. | 326/86 |
| 5,089,951 | 2/1992 | Iijima | 395/856 |
| 5,323,357 | 6/1994 | Kaneko | 365/230.06 |
| 5,426,376 | 6/1995 | Wong et al. | 326/27 |
| 5,525,992 | 6/1996 | Froschermeier | 342/42 |
| 5,754,058 | 5/1998 | Moon et al. | 326/26 |

*Primary Examiner*—Jon Santamauro

[57] ABSTRACT

A device for electrically isolating an external device or internal device from an internal signal bus on a semiconductor substrate is disclosed. The device includes a set of drivers which couple an internal signal bus to an external signal bus and a set of drivers which couple the internal signal bus to an internal device signal bus. A driver enable signal generator generates a signal which enables one set of drivers to electrically couple the internal signal bus to either the external device signal bus or the internal device signal bus. The driver enable signal generator generates the driver enable signal in correspondence with the state of a signal indicating the presence or absence of an external device and a signal indicating whether a data transfer operation is occurring. If the external device is present and a data transfer operation is occurring, the internal signal bus is coupled to the external device signal bus. If an external device is not present and a data transfer operation is occurring, the internal device signal bus is coupled to the internal signal bus. In this manner, the electrically isolating device is capable of electrically isolating both internal and external devices from the internal signal bus except during I/O operations. The preferred embodiment uses a dual set of drivers to drive data signals from an internal data bus to either an internal device data bus or an external device data bus while a multiplexer and a single driver are used to electrically couple data from the internal data bus to either an internal device data bus or an external device data bus.

6 Claims, 2 Drawing Sheets

METHOD AND DEVICE FOR ISOLATING NOISE SENSITIVE CIRCUITRY FROM SWITCHING CURRENT NOISE ON SEMICONDUCTOR SUBSTRATE

FIELD OF THE INVENTION

This invention relates to isolating electronic circuitry from electrical noise, and, more particularly, to electrically isolating electronic components from electrical noise generated by switching currents on input/output ("I/O") pads within an integrated circuit.

BACKGROUND OF THE INVENTION

Integrated circuits ("ICs") are well known. ICs include literally hundreds of thousands, even millions, of transistors which are logically coupled to one another to provide arithmetic and logic units, address decoders, memory, control registers, and the like. While the computational ability and logical processing provided by such ICs can be quite extraordinary, the capabilities of these ICs are of little value unless the IC is coupled to receive inputs from an external device or provide outputs to an external device. The electrical connection between the internal transistors provided on a semiconductor substrate inside an IC and the circuit traces provided on a printed circuit card or the like is usually achieved through a conductive pin mounted to the housing for the IC. One end of the conductive pin extends outwardly from the housing so it may be soldered or otherwise connected to a circuit trace on a printed circuit card. The other end of the conductive pin extends inside the housing and is coupled to an I/O pad on the substrate through conductive elements, usually gold wires, which are bonded at one end to the pin and at the other end to the I/O pad.

In order to provide a signal to an external device which is very susceptible to electrical noise on the printed circuit card, the current supply in the signals provided to the I/O pads have substantially more current than those signals provided internally between transistors of the IC. This additional current is provided by drivers at the I/O pad responding to signals on the signal bus or buses coupled to an I/O pad. Because the I/O pads are coupled to the signal buses on the semiconductor substrate, signals on these internal buses cause the drivers to operate. For example, the internal data bus of an IC has many data words communicated across it, only some of which are transferred to an external device. However, all of this data operates the drivers at the I/O pads. Because most state of the art ICs communicate signals at very high switching rates, noise may be induced in conductive elements in the vicinity of the I/O pads being driven by the data on the internal data bus, for example. This electrical noise may affect the operation of an external device coupled to the I/O pads. For example, analog/digital and digital/analog converters may generate or use precision data or signals. Such circuits, for example, require a reference voltage having little variation about its reference value so the component correctly generates digital data corresponding to an analog signal or accurately generates an analog signal corresponding to digital data. Such a precision electronic component may be coupled to an IC through the I/O pads. Signals switching over an internal data bus coupled to I/O pads may induce noise which affects the reference voltages or other signals required for operation of the external device.

In an effort to address electrical noise problems in ICs, a number of noise reducing circuits have been devised. For example, some have determined that the power and ground conductive pins of an IC respond like an inductor when current loads change through the pins. Consequently, one way to reduce switching noise is to reduce power and ground pin inductance by adding additional power and ground pins to the IC. However, by allocating more of the conductive pins for coupling the semiconductor substrate of the IC to external power and ground sources, fewer pins are available for actual data or control signals. Another solution to the problem of switching noise is to reduce the rate of change of current through power and ground pin inductances. For example, U.S. Pat. No. 4,825,102 describes an output driver which turns one driving circuit off before it turns another driving circuit on in an effort to reduce the changing current loads. Other methods, such as that taught in U.S. Pat. No. 4,827,159, include using inverters with different switching thresholds to cause drivers to turn on and off at different times, again with the intention of reducing changing current loads. Another approach, described in U.S. Pat. No. 5,426,376, provides a transient switching circuit and a logic holding circuit which separate first and second power and ground voltage sources from one another to reduce the switching noise. While each of these approaches reduces the amount of current, and consequently noise, it usually requires that most, if not all, of the I/O pad drivers for the IC implement the noise reducing circuitry. The pervasive implementation of these solutions add complexity and cost to the fabrication of IC's.

What is needed is a way to electrically isolate external electronic components or devices or electrical noise generated by changing currents at the I/O pads without requiring modification of most of the I/O pads of an IC.

SUMMARY OF THE INVENTION

The limitations of previously known noise reducing circuitry for ICs are overcome by a system and method performed in accordance with the principles of the present invention. The method of the present invention includes the steps of selectively coupling an external device signal bus to an internal device signal bus during a data transfer operation so that I/O pads on the external signal data bus are electrically coupled to changing currents only during the data transfer operation. This method reduces the amount of time that the I/O pads are subjected to changing current loads and, consequently, reduces the likelihood that noise is induced by changing currents at the I/O pads of the external device signal bus. The method of the present invention may also include the step of selectively electrically coupling one of the external device signal bus and an internal device signal bus to the internal signal bus during a data transfer operation so that the I/O pads of the external device signal bus and the internal device coupled to the internal device signal bus are electrically isolated from changing currents on the internal device signal bus except during data transfer operations to the external device signal bus or the internal device signal bus.

The device of the present invention selectively electrically couples an external device data bus to an internal data bus on a semiconductive substrate to reduce the amount of time the I/O pads of the external device data bus are coupled to the changing currents on the internal data bus. This, in turn, reduces the noise induced into the external device coupled to the external device data bus through the I/O pads. Preferably, the external device data bus is selectively coupled to the internal data bus when data is either available on the internal data bus for transfer to the external device data bus or when data is generated and provided by the external device over the external device data bus to the internal data bus of the IC.

Because the external device data bus is only coupled to the internal data bus during a data transfer operation, the external device operation which may require precise electrical signals is performed while the external device is electrically isolated from changing currents on the internal data bus. Thus, the device which selectively couples the external device data bus to the internal bus of the IC reduces the likelihood that noise will interfere with the operation of the external electrical device.

The preferred device of the present invention includes a set of selectable output drivers for coupling the internal data bus on a semiconductor substrate to an external device output bus and an output driver enable signal generator. The output driver enable signal generator generates a signal to enable the set of output drivers in response to an external device signal indicating an external device is coupled to an external device signal bus and a data operation signal indicating data is available for transfer between the external device output bus and the internal data bus of the IC. Thus, the device of the present invention only drives the I/O pads for a data output or write operation between the external device output bus and the internal data bus of the IC during the data transfer operation. Because the output driver enable signal generator only generates an active state enable signal which electrically couples the internal data bus to the external device output bus if an external device is present, there is no electrical coupling of the I/O pads of the external device output bus to the internal data bus in the event an internal electronic component or device provided on the semiconductor substrate is used. As a result, the IC may either use an internal device or an external device without significantly impairing the operation of either device with noise induced by changing currents on the internal data bus.

Most preferably, the device of the present invention includes a set of selectable output drivers and a set of selectable input drivers. The set of selectable output drivers couples the internal data bus of the semiconductor substrate to I/O pads which transfer data to an external device data bus and the set of selectable input drivers couples the internal data bus to the I/O pads which receive data from an external device data bus. The set of output drivers are selectively enabled by a signal from an output driver enable signal generator which generates an active state enable signal in response to the presence of a signal indicating an external device is coupled to the external device data bus and a signal indicating the occurrence of an external data transfer operation. The set of selectable input drivers are enabled by a signal from a input driver enable signal generator which generates an active state enable signal in response to the presence of the external device and a signal indicating the occurrence of an input data transfer operation. The inventive device couples the external device data bus to the internal data bus of the semiconductor substrate only during data transfer operations, such as read and write. Since data transfer operations are relatively short in temporal duration, the amount of time in which noise may be generated by changing currents at the I/O pads on the semiconductor substrate is reduced.

In a most preferred embodiment of the present invention, the inputs of the set of input drivers are coupled to the outputs of a set of multiplexers. Each multiplexer has at least a pair of inputs, an input selector, and an output. One input of each multiplexer is coupled to an I/O pad on the external device data bus and the other multiplexer input is coupled to a line on an internal device data bus for an internal device. The external device indicating signal is coupled to the input selector of each multiplexer. When the external device signal indicates an external device is present, the input signal from an I/O pad on the external device data bus is electrically coupled through the multiplexer to the input of the corresponding driver in the set of input drivers. Otherwise, the multiplexer electrically couples data from the internal component on the internal device data bus to the input of the corresponding driver in the set of input drivers. This structure selectively provides input from either the external device or the internal device to the internal data bus, but again, only electrically couples the input data from one of these buses to the internal data bus during a data transfer operation. This either reduces the time that the I/O pads of the external device data bus are electrically coupled to the changing currents of the internal data bus or electrically decouples the external device data bus from both the internal data bus and the internal device data bus when no external device is present. This reduces the likelihood that noise from changing currents on the I/O pads interfere with data on the internal device data bus being transferred from and to the internal device bus.

In the most preferred embodiment, another set of drivers are provided with the output drivers to couple data from the internal data bus to the internal device data bus. The active enable signal for this other set of drivers is the logical inverse of the active state for the enable signal generated by the output driver enable signal generator. Thus, the other set of output drivers provide data from the internal data bus to the internal device data bus during a data output or write operation if no external device is coupled to the external device data bus.

The most preferred embodiment also includes a coupling circuit for selectively electrically coupling an internal address bus to a device address bus. The address coupling circuit couples the internal address bus to the device address bus in response to an address coupling enable signal. The address coupling enable signal is logically active when the address data on the internal address bus indicates the occurrence of a data transfer operation to either the internal device or external device. While the device address bus is electrically coupled to both the internal device and the I/O pads to which an external device may be coupled, noise is not induced at the internal device by changing currents in the I/O pads because, in the most preferred embodiment, an I/O pad enabler decoder disables the I/O pad drivers coupled to the device address bus in response to a signal indicating no external device is coupled to the I/O pads for the device address bus. In embodiments where the I/O pad enabler decoder does not selectively enable I/O pad drivers coupled to the device address bus, the device address bus may be separated into an internal device address bus and an external device address bus and selectively electrically coupled to the internal address bus in a manner similar to that described above with respect to the selective electrical coupling of the internal data bus to the internal device data bus and the external device data bus.

The signal indicating whether an external device is coupled to I/O pads on the external device data bus is preferably derived from a signature or identifier received from the external device which is generated in response to a reset signal. The signature data are coupled to combinational logic which preferably generates a logic low when an external device is present, although other circuits which generate a signal indicative of a predetermined condition may be used.

These and other benefits and advantages of the present invention may be ascertained from the general description given above and the detailed description given below.

BRIEF DESCRIPTION OF THE DRAWINGS

The accompanying drawings, which are incorporated and constitute a part of the specification, illustrate preferred and alternative embodiments of the present invention and, together with a general description given above and the detailed description of the embodiments given below, serve to explain the principles of the present invention.

DETAILED DESCRIPTION OF THE INVENTION

Figure 1:
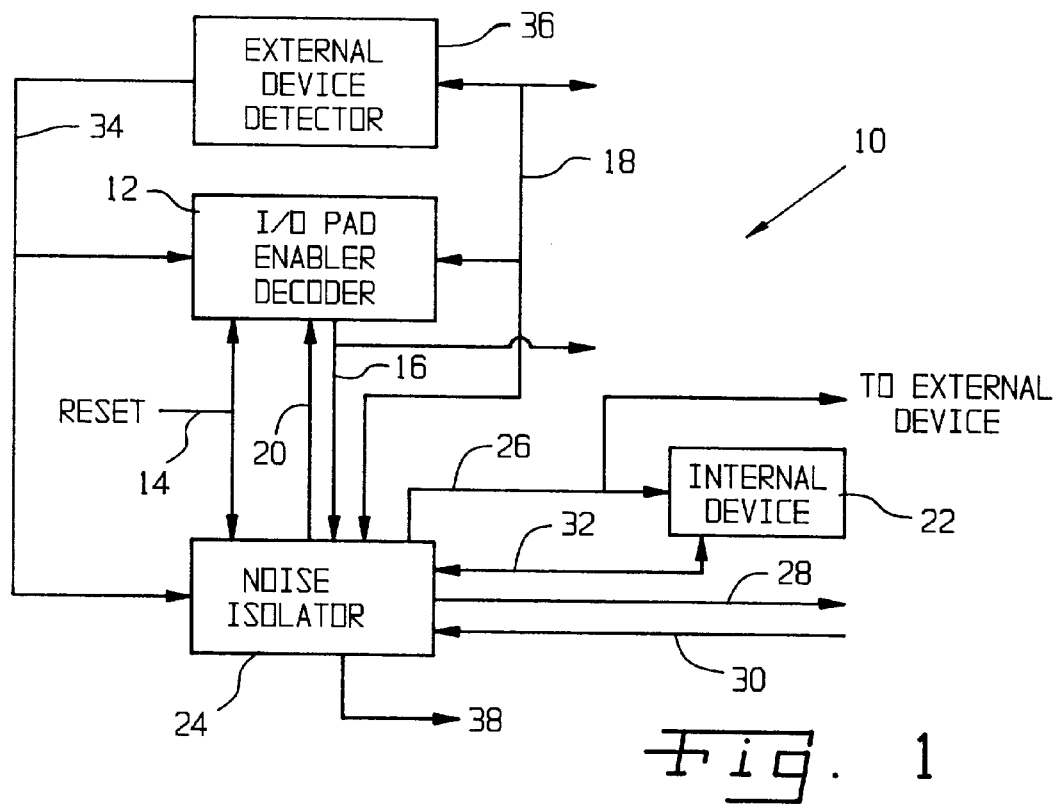
FIG. 1 is a block diagram of a system using the noise isolator of the present invention.

A block diagram of a system using the noise isolator of the present invention is shown in FIG. 1. The reader should appreciate that system 10 is implemented on a semiconductor substrate for an integrated circuit ("IC"). System 10 typically includes an I/O pad enabler decoder 12 or other control circuitry used to selectively enable I/O pads for the IC. Coupled to decoder 12 is a reset line 14 which is used to initialize the status of the various components and devices in the IC. A bidirectional internal data bus 18 is used to provide data to and from other components located throughout the IC. Data transfer control signals, such as read or write signals and chip or device select signals, may be generated by decoder 12 for devices coupled to decoder 12. For example, chip select signals may be generated from the values placed on an internal address bus 16 to identify a component or device on the IC which is to be used for a data transfer operation. Precision device 22 may be any number of known internal components which may require precise signals for operation, such as analog/digital converter ("A/D") or the like. An internal device data bus 32 and device address bus 26 are multisignal buses which couple internal device 22 to noise isolator 24. Noise isolator 24 is also coupled to internal data bus 18 and data transfer control bus 20. Noise isolator 24 is also coupled to an external device output bus 28 and an external device input bus 30. Device address bus 26 also couples to I/O pads so an external device may receive address signals from internal address bus 16. An external device signal 34 is generated by external device detector 36 and provided to noise isolator 24 and decoder 12. Additionally, external data transfer signals 20 and external reset signal 38 are provided by noise isolator 24 to I/O pads for an external device.

External device input bus 30 is a multi-signal bus which electrically couples data from I/O pads into noise isolator 24. In like manner, external device output bus 28 has multiple lines which provide data to multiple I/O pads which may be coupled to an external device. External device detector 36 determines whether an external device is electrically coupled to external device input bus 30, preferably, at system reset and generates external device signal 34 which indicates whether an external device is electrically coupled to the I/O pads of external device input bus 30. If external device signal 34 indicates an external device is electrically coupled to external device input bus 30, internal device data bus 32 is electrically decoupled from internal data bus 18. Likewise, if external device signal 34 indicates that no external device is electrically coupled to external device input bus 30, then the external device input bus 28 and output bus 30 are electrically decoupled from internal data bus 18.

Figure 2:
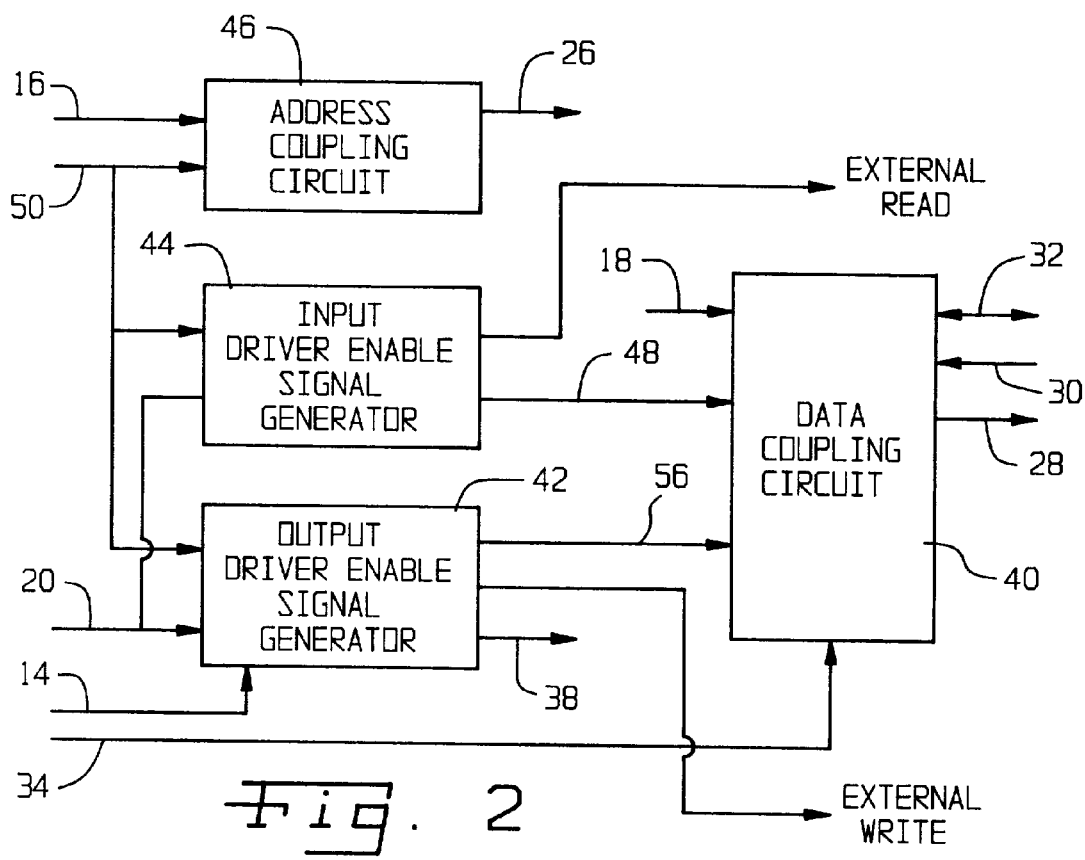
FIG. 2 is a block diagram of the noise isolator of FIG. 1.

Noise isolator 24, as shown in FIG. 2, includes a data coupling circuit 40, an output driver enable signal generator 42, an input driver enable signal generator 44 and an address coupling circuit 46. Under the control of input driver enable signal generator 44, data coupling circuit 40 either electrically couples internal data bus 18 to internal device data bus 32 or external device input bus 30. Under control of output driver enable signal generator 42, data coupling circuit 40 electrically couples internal data bus 18 to internal device data bus 32 or external device output bus 28. Input driver enable signal generator 44 generates input driver enable signals 48 from a device select signal 50 and data input control signals received from data transfer control bus 20. Input driver enable signal generator 44 also generates an external device input signal 52. Output driver enable signal generator 42 generates output driver enable signal 56 from data output control signals received from data transfer control bus 20, reset signal 14 and external device signal 34. Output driver enable signal generator 42 also generates external reset signal 38 for the external device, if coupled to the IC. Address coupling circuit 46 selectively electrically couples internal address bus 16 to device address bus 26. The selective electrical coupling of the internal address bus to the device address bus is performed under the control of device select signal 50.

Figure 3:
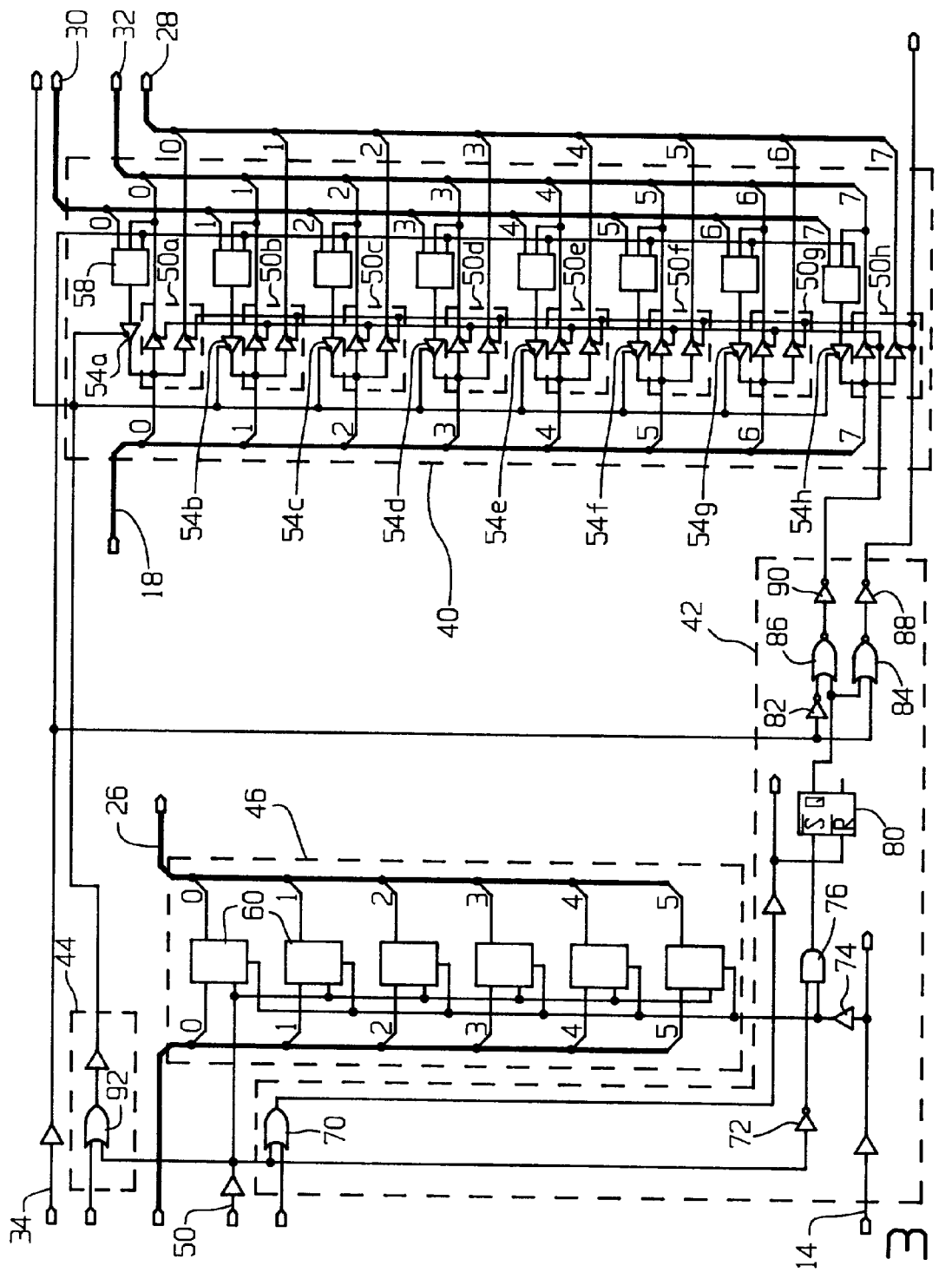
FIG. 3 is a schematic logical diagram of the noise isolator shown in FIG. 2.

A schematic logical diagram of isolator 24 is shown in FIG. 3. As shown there, noise isolator 24 includes data coupling circuit 40 which is controlled by output driver enable signal generator 42 and input driver enable signal generator 44. Preferably, data coupling circuit 40 is comprised of a set of output driver circuits 50a–h which electrically couple internal data bus 18 either to internal device data bus 32 or external device output bus 28. Driver circuits 50a–h are controlled by output driver enable signal generator 42. The set of input drivers 54a–h selectively electrically couple internal data bus 18 either to external device input bus 30 or internal device data bus 32. Drivers 54a–h are controlled by input driver enable signal generator 44.

Address coupling circuit 46 preferably includes a plurality of gate latches 60. Each latch includes an input which is coupled to one of the lines of the multisignal internal address bus 16. The gate control for latches 60 are coupled to one another and to device select signal 50. The outputs of the latches 60 are coupled to multisignal device address bus 26. The reset inputs for latches 60 are coupled together and coupled to the output of inverter 74. Inverter 74 has its input tied to reset signal 14. When reset signal 14 is active, the latches are reset so a logic low signal is placed on device address bus 26. When a data transfer operation occurs, the device select signal 50 becomes active by, preferably, going to a logic low state which enables latches 60 to couple internal address bus 16 to device address bus 26. Thus, during a data transfer operation, such as a read or write operation, device address bus 26 and internal address bus 16 are electrically coupled together for the transfer of address data from one to the other.

In more detail, data coupling circuit 40 includes multiplexers 58a–h which have their outputs coupled to the input of drivers 54a–h, respectively. Multiplexers 58a–h, preferably, include a pair of inputs which are, preferably, coupled to internal device data bus 32 and external device input data bus 30. Multiplexers 58a–h also include a select line which is coupled to external device signal 34. Depending upon the logical state of external device signal 34, either external device input bus 30 or internal device data bus 32 is electrically coupled to the input of driver circuits 54a–h through the multiplexers 58a–h. Provided driver circuits 54a–h are enabled by input driver enable signal generator 44, the input signals passed by multiplexers 58a–h are electrically coupled onto internal data bus 18. The operation of input driver enable signal generator 44 is discussed in more detail below.

Each driver circuit 50a–h preferably includes a pair of drivers having their inputs coupled to internal data bus 18. The output of one of the drivers is coupled to internal device data bus 32 and the output of the other driver is coupled to external device output bus 28. The bus to which internal data bus 18 is electrically coupled depends upon which driver is enabled within each driver circuit as the driver enable conditions are set to be mutually exclusive. That is, each driver in circuits 50a–h which selectively electrically couple internal data bus 18 to internal device data bus 32 is preferably enabled by an active signal from enable signal generator 42 which is the logical inverse of the active state enable signal which enables the driver that electrically couples internal data bus 18 and external device output bus 28. Preferably, the enable signal to electrically couple internal data bus 18 and internal device data bus 32 is generated in response to no external device being coupled to external device input bus 30 and the occurrence of a write data transfer operation. Likewise, each driver in circuits 50a–h which electrically couple internal data bus 18 to external device output bus 28 is, preferably, enabled by signal generator 42 in response to an external device being coupled to external device input bus 30 and the occurrence of a write data operation.

As shown in FIG. 3, output driver enable signal generator 42 preferably includes logical OR gate 70, inverter 72, inverter 74, AND gate 76, flip-flop 80, inverter 82, a pair of NOR gates 84, 86, and a pair of inverters 88, 90. Although these gates are coupled in the manner shown in FIG. 3 to most preferably implement the principles of the present invention, other logic arrangements and types of logical circuits may be used to generate appropriate signals for selectively electrically coupling one or more signal buses on a semiconductor substrate to a bus coupled to I/O pads or another internal signal bus. The inputs of OR gate 70 are coupled to device select signal 50 and a write operation signal from data transfer control bus 20. Although, the operation of noise isolator 24 is discussed with particular reference to read and write data transfers, it should be understood that other data transfer operation signals may be used as well, such as input and output signals, direct memory access (DMA) signals and the like. The output of OR gate 70 is coupled to the reset line of flip-flop 80. Device select signal 50 is also inverted by inverter 72 and provided to one input of AND gate 76. The other input of AND gate 76 is coupled to the output of inverter 74 which inverts the state of reset signal 14. The output of AND gate 76 is coupled to the $\overline{S}$ input of flip-flop 80. The Q output of flip-flop 80 is coupled to one input of each NOR gate 84 and 86. The other input of NOR gate 84 is coupled to external device signal 34 while the other input of NOR gate 86 is coupled to the inverted state of external device signal 34 as generated by inverter 82. The output of NOR gate 86 is inverted by inverter 90 and provided as an output driver enable signal to the drivers in circuits 50a–h which couple internal data bus 18 to internal device data bus 32. The output of NOR gate 84 is inverted by inverter 88 and provided as an output driver enable signal to the drivers in circuits 50a–h which couple internal data bus 18 to external device output bus 28. The operation of output driver enable signal generator 42 is described in more detail below.

The input driver enable signal generator 44 is comprised of OR gate 92. The inputs of OR gate 92 are coupled to a read data control signal from data transfer control bus 20 and device select signal 50. The output of OR gate 92 is coupled to the driver enable input of drivers 54a–h. These drivers couple the output of multiplexers 58a–h to internal data bus 18. The operation of input driver enable signal generator 44 is described in more detail below.

Output driver enable signal generator 42 operates in the following manner during system reset to electrically isolate and decouple internal data bus 18 from both internal device data bus 32 and external device output bus 28. At system reset, reset signal 14 goes to an active state, preferably a logic high, for a period of time until reset operations are finished. The reset signal is also provided to an I/O pad for output to an external device if one is coupled to the IC. After reset, reset signal 14 typically remains inactive, preferably at a low logical state. When reset signal 14 goes high, it is inverted by inverter 74 and supplied as a logical low to one input of AND gate 76. The inverted reset signal is also provided to the reset input of latches 60 of address coupling circuit 46 to reset the Q outputs of latches 60 to a logical low state. The logic low on the input of AND gate 76 during reset causes the output of AND gate 76 to be a logical low which is provided to the $\overline{S}$ input of flip-flop 80. A logical low on the $\overline{S}$ input of flip-flop 80 causes the Q output of flip-flop 80 to become a logical high. This logical high is provided to one input of NOR gates 84, 86 which causes their outputs to go low. The logical low outputs of gates 84, 86 are inverted to logical highs by inverters 88, 90, respectively, to provide an inactive state signal to the driver enable input of both drivers in each driver circuit 50a–h. Thus, internal bus 18 is electrically decoupled and isolated from both internal device bus 32 and external device output bus 28.

Input driver enable signal generator 44 operates during system reset in the following manner. During system reset, both device select signal 50 and the read data control signal from data transfer control bus 20 are asserted as logically active which preferably is a logical low. These logical lows are provided as inputs to OR gate 92 which cause its output to go to a logical low. The logical low output of gate 92 provides an active state signal to the enable input of drivers 54a–h. The output of gate 92 is also provided to an I/O pad for output as a read data control signal to an external device, if one is coupled to the IC. In response to the reset signal and read data control signal being active, an external device, such as an A/D converter, provides an identifier which, preferably, is the assertion of all data lines on external device input bus 30 as logical high signals, although other data values may be used as an identifier of the external device. Because external device signal 34 is coupled to the select input of multiplexers 58a–h and asserted as a logical low during reset, the identifier data is passed through multiplexers 58a–h to the input of drivers 54a–h. Since drivers 54a–h are enabled by the logical low output of OR gate 92, the identifier data is passed by internal data bus 18 to external device detector 36. External device detector 36 includes logic circuits which generate a signal indicating whether an external device is coupled to external device input data bus 30. Preferably, the logic circuit is an eight (8) input NAND gate (not shown) which generates a logic low signal in response to the preferred all logic high identifier being provided on its inputs. The output of the NAND gate is preferably latched so it remains constant after internal data bus 18 is electrically decoupled from external device input data bus 30. Thus, external device detector 38 generates external device signal 34 which indicates whether an external device is coupled to external device input data bus 30.

Following system reset, reset signal 14 goes to a logical low and the output of inverter 74 goes to a logical high so that the output of AND gate 76 is thereafter controlled by the inverted state of device select signal 50 provided at the output of inverter 72. Device select signal 50 and the write data control signal also return to their inactive levels which is preferably a logic high. This causes AND gate 76 to have a logic high at its output which causes flip-flop 80 to assert a logical high on its output which continues to disable the drivers of circuits 50a–h to electrically decouple and isolate internal bus 18 from external device output bus 28 and internal device data bus 32 as explained above. The return of the read data control signal to a logic high provides an inactive state signal to the enable input of drivers 54a–h which disables drivers 54a–h so internal data bus 18 is electrically decoupled from external device input data bus 30 and internal device data bus 32. The drivers of circuits 50a–h and 54a–h remain disabled until a data transfer operation occurs.

At the occurrence of a write data operation, the write signal input to OR gate 70 and device select signal 50 to OR gate 70 both go low which drives the output of OR gate 70 low which causes the $\overline{R}$ input of flip-flop 80 to go low and reset flip-flop 80. Also, the inverted state of device select signal 50 at the output of inverter 72 causes the output of AND gate 76 to go high since the other input of AND gate 76 is also high. The low signal at the $\overline{R}$ input causes the Q output of flip-flop 80 to go low and NOR gates 84 and 86 now respond to the other inputs of each of these gates. Since the other inputs of each of these gates are tied to the true and not true condition of external device signal 34, NOR gates 84 and 86 now produce logically different signals. If external device signal 34 indicates an external device is present by, preferably, being a logical low, the output of NOR gate 84 remains a logical high while the output of NOR gate 86 goes to a logical low. The output of gate 84 is inverted by inverter 88 to a logic low and the output of gate 90 is inverted to a logical high. As discussed above, the logical high signal is an inactive state signal which causes the drivers in driver circuits 50a–h which couple internal data bus 18 to internal device data bus 32 to electrically decouple bus 18 from bus 32. The logical low from inverter 88 to the drivers coupling internal database 18 to external device output bus 28 is an active signal which enables the drivers to electrically couple bus 18 to bus 28 so data may be transferred from internal data bus 18 to external device output bus 28. Only during the occurrence of the write operation in which the write data signal and device select signal 50 are both active are internal data bus 18 and external device output bus 28 electrically coupled to one another through driver circuits 50a–h. As a result, the electrical coupling between the I/O pads of the external device output bus and internal data bus 18 is limited to the time of the write data operation.

If an external device is not present, external device signal 34 is a logical high and the output of NOR gate 86 becomes a logic high while the output of NOR gate 84 becomes a logic low. Consequently, the output of inverters 90 and 88 become, respectively, a logic low and a logic high. This causes the drivers coupling internal data bus 18 to external device output bus 28 to be disabled and the drivers coupling internal data bus 18 to internal device data bus 32 to become enabled. In this manner, bus 18 is electrically coupled to bus 32 and data may be transferred from internal data bus 18 to internal device data bus 32. Again, this electrical coupling only occurs for as long as the write data signal is present for the data transfer operation. Once the write data or device select signal goes to a logic high condition, the $\overline{R}$ input to flip-flop 80 goes high. When device select signal 50 goes high, the output of inverter 72 goes low and the output of AND gate 76 also goes low. This causes the $\overline{S}$ input to flip-flop 80 to go low which drives the Q output of flip-flop 80 to a logic high state. As discussed above, a logic high state on the Q output of flip-flop 80 causes the output of NOR gates 84 and 86 to go to logic low states and the inverters 88 and 90 cause these signals to be inverted to logic high states which disable the drivers coupling internal data bus 18 to either internal device data bus 32 or external device output bus 28. As can be seen, output driver enable signal generator 42 controls driver circuits 50a–h so that internal data bus 18 is selectively electrically coupled to either internal device data bus 32 or external device output bus 28 for data transfers only during write data operations. Additionally, since external device signal 34 remains constant throughout operation of the IC following reset, internal data bus 18 is only coupled to one of the data buses 32 or 28 during write or output operations until the next reset.

Operation of input driver enable signal generator 44 is now described in more detail. During a read data operation, device select signal 50 and read data signal go low causing OR gate 92 to generate a low output. This low output is provided to the driver enable input of drivers 54a–h. This low signal is an active state signal which enables these drivers so that the outputs of multiplexers 58a–h are electrically coupled to internal data bus 18. Again, as soon as device select or the read data signal goes to a logic high state, the drivers 54a–h receive an inactive state signal on their enable inputs and the output of the multiplexers are electrically decoupled from internal data bus 18. The signals on the outputs of multiplexers 58a–h are determined by the state of external device signal 34. As previously discussed, external device signal 34 is coupled to the select inputs of multiplexers 58a–h. If external device signal 34 indicates an external device is present, preferably by being a logic low, the input lines coupled to external device input bus 30 are electrically coupled through multiplexers 58a–h to driver circuits 54a–h. If an external device is not present, external device data bus signal 34 causes the inputs from internal device data bus 32 to be electrically coupled through multiplexers 58a–h to drivers 54a–h for transfer to internal data bus 18. Again, because external device signal 34 remains constant following system reset, only one of the two data buses 30 or 32 are selectively coupled to internal data bus 18 during read data operations.

The device of the present invention uses data transfer control signals typically generated by most ICs along with a signal indicating whether an electronic device is being provided by an on-chip component or an external component. These signals are then used to selectively enable a set of driver circuits to selectively electrically couple an internal data bus to an internal device data bus or an external device data bus. Most preferably, the structure of the data coupling circuit and the input driver enable signal generator is simplified by the use of a multiplexer to select whether signals from the external device or the internal device are electrically coupled to the input drivers. These drivers are selectively enabled by the active state of data transfer control signals typically associated with a read data operation. The output driver enable signal generator is preferably controlled at reset to decouple all of the output data buses from the internal data bus. After reset, the output driver enable signal generator enables a driver circuit to electrically couple the internal data bus to either the internal device data bus or external device output bus. The determination as to which bus receives data from the internal data bus is determined by the state of the external device signal. If the external device signal indicates an external device is present, the internal data bus is electrically coupled to the external data bus during a write data transfer operation. If an external device is not coupled to the IC, the internal data bus is electrically coupled to the internal device data bus during write data transfer operations.

Preferably, the internal address bus is also selectively electrically coupled to a device address bus. In the preferred embodiment, the device address bus is not separated into an internal device address bus and external device address bus since the I/O pad enabler decoder may selectively enable the drivers for the I/O pads which provide address signals from the device address bus to an external device. Alternatively, the device address may be separated into an external address bus and an internal address bus and controlled in a manner similar to the separated internal device data bus and external device output bus as discussed above. As discussed above with respect to the preferred embodiment, the internal device data bus is a bi-directional bus while the external device data bus is separated into an external device output bus and an external device input bus. Following the principles of the present invention, the selective electrical coupling of the internal data bus to the internal device data bus or external device data bus may be performed for a bi-directional device data bus or an internal device data bus which is separated into an internal device input bus and an internal output bus. In another alternative embodiment, the multiplexers 58*a–h* and drivers 54*a–h* may be replaced by driver circuits having a pair of drivers which are selectively enabled by enable signals having a mutually exclusive active state, as discussed above with respect to driver circuits 50*a–h* for the electrical coupling of internal data bus 18 to transfer data to internal device data bus 32 or external device output bus 28.

While the present invention has been illustrated by the description of the preferred and alternative embodiments and while the embodiments have been described in considerable detail, it is not the intention of the applicants to restrict or anyway limit the scope of the appended claims to such detail. Additional advantages and modifications will readily appear to those skilled in the art. For example, latches and other components having a selective coupling function similar to the drivers discussed herein may be used instead of drivers to selectively electrically couple an internal signal bus to an external device signal bus or an internal device signal bus. The invention's broader aspects are therefore not limited to the specific details, represented apparatus and method, an illustrative example shown and described. Accordingly, departures may be made from such details without departing from the spirit or scope of applicant's general inventive concepts.

What is claimed is:

1. A method for selectively electrically isolating an internal device signal bus of a semiconductor substrate from a second signal bus of said semiconductor substrate, comprising the steps of:

electrically coupling said internal device signal bus of said semiconductor substrate to said second signal bus of said semiconductor substrate during an internal device operation for an internal device coupled to said internal device signal bus; and electrically decoupling said internal device signal bus from said second signal bus following said device operation, wherein said coupling step further comprises:

generating a latch enable signal; and providing said latch enable signal to a latch coupling said internal device signal bus to said second signal bus so said internal device signal bus and said second signal bus are electrically coupled and signals may be transferred between said internal device signal bus and said second signal bus in response to said latch enable signal being in an active state.

2. The method of claim 1 said generating said latch enable signal step further comprising the steps of:

generating said latch enable signal in an active state in response to a signal indicating said device operation is occurring.

3. A method for selectively electrically isolating an internal device signal bus of a semiconductor substrate from a second signal bus of said semiconductor substrate, comprising the steps of:

electrically coupling said internal device signal bus of said semiconductor substrate to said second signal bus of said semiconductor substrate during an internal device operation for an internal device coupled to said internal device signal bus; and electrically decoupling said internal device signal bus from said second signal bus following said device operation, wherein said decoupling step further comprises the steps of:

generating a latch enable signal; and providing said latch enable signal to a latch coupling said internal device signal bus to said second signal bus so said internal device signal bus and said second signal bus are electrically decoupled and changing currents from said second signal bus are not transferred to said internal device signal bus in response to said latch enable signal being in an inactive state.

4. The method of claim 3 said generating said latch enable signal step further comprising the steps of:

generating said latch enable signal in said inactive state in response to a signal indicating said device operation is not occurring.

5. A device for electrically isolating an external device data bus from an internal data bus on a semiconductor substrate comprising:

a first set of selectable drivers operable to (i) electrically couple signals from an internal data bus on a semiconductor substrate to an external device data bus in response to a first driver enable signal having a first state, and (ii) electrically decouple signals of said internal data bus from said external device data bus in response to said first driver enable signal having a second state;

a second set of selectable drivers operable to (i) electrically couple signals from said external data bus to said internal data bus in response to a second driver enable signal having a first state, and (ii) electrically decouple signals of said external data bus from said internal data bus in response to said second driver enable signal having a second state;

a first driver enable signal generator operable to (i) generate said first driver enable signal having said first state in response to an external device signal indicating an external device is coupled to said external device data bus and a data transfer operation signal indicating a write data operation to said external device, and (ii) generate said first driver enable signal having said second state in response to said external device signal indicating said external device is coupled to said external device data bus and said data transfer operation signal not indicating said write data operation;

a second driver enable signal generator operable to (i) generate said second driver enable signal having said first state in response to said external device signal indicating said external device is coupled to said external device data bus and said data transfer operation signal indicating a read data operation from said external device, and (ii) generate said second driver enable signal having said second state in response to said external device signal indicating said external device is coupled to said external device data bus and said data transfer operation signal not indicating said read data operation; and a plurality of multiplexers, each said multiplexer having (i) one input coupled to an internal device data bus line of an internal device data bus, (ii) a second input coupled to an external device data bus line of said external device data bus, (iii) a select line coupled to said external device signal, and (iv) an output coupled to an input of said second set of drivers, wherein said plurality of multiplexers electrically couples one of said internal device data bus and said external device data bus to said second set of drivers in correspondence with a logical state of said external device signal.

6. A device for electrically isolating an external device data bus from an internal data bus on a semiconductor substrate comprising:

a first set of selectable drivers operable to (i) electrically couple signals from an internal data bus on a semiconductor substrate to an external device data bus in response to a first driver enable signal having a first state, and (ii) electrically decouple signals of said internal data bus from said external device data bus in response to said first driver enable signal having a second state;

a second set of selectable drivers operable to (i) electrically couple signals from said external data bus to said internal data bus in response to a second driver enable signal having a first state, and (ii) electrically decouple signals of said external data bus from said internal data bus in response to said second driver enable signal having a second state;

a third set of selectable drivers operable to (i) electrically couple said internal data bus to an internal device data bus of said semiconductor substrate in response to a third driver enable signal having a first state, and (ii) electrically decouple said internal data bus from said internal device data bus in response to said third driver enable signal having a second state;

a first driver enable signal generator operable to (i) generate said first driver enable signal having said first state in response to an external device signal indicating an external device is coupled to said external device data bus and a data transfer operation signal indicating a write data operation to said external device, (ii) generate said first driver enable signal having said second state in response to said external device signal indicating said external device is coupled to said external device data bus and said data transfer operation signal not indicating said write data operation, (iii) generate said third driver enable signal having said first state in response to an external device signal indicating no external device is coupled to said external device data bus and said data transfer operation signal indicating said write data operation, and (iv) generate said third driver enable signal having said second state in response to said external device signal indicating no external device is coupled to said external device data bus and said data transfer operation signal not indicating said write data operation; and a second driver enable signal generator operable to (i) generate said second driver enable signal having said first state in response to said external device signal indicating said external device is coupled to said external device data bus and said data transfer operation signal indicating a read data operation from said external device, and (ii) generate said second driver enable signal having said second state in response to said external device signal indicating said external device is coupled to said external device data bus and said data transfer operation signal not indicating said read data operation.

* * * * *